United States Patent [19]
Rosenfeld

[11] Patent Number: 5,267,611
[45] Date of Patent: Dec. 7, 1993

[54] SINGLE PHASE POROUS LAYER HEAT EXCHANGER

[75] Inventor: John H. Rosenfeld, Lancaster, Pa.

[73] Assignee: Thermacore, Inc., Lancaster, Pa.

[21] Appl. No.: 2,329

[22] Filed: Jan. 8, 1993

[51] Int. Cl.$^5$ ............................................. F28F 3/12
[52] U.S. Cl. ..................... 165/168; 165/170; 165/907; 165/104.26; 122/366
[58] Field of Search ........... 165/168, 170, 907, 104.26; 122/366

[56] References Cited

U.S. PATENT DOCUMENTS

| | | | |
|---|---|---|---|
| 3,201,858 | 8/1965 | Valyi | 165/907 |
| 3,598,180 | 8/1971 | Moore, Jr. | 165/104.26 |
| 3,750,745 | 8/1973 | Moore, Jr. | 165/104.26 |
| 4,359,086 | 11/1982 | Sanborn et al. | 165/907 |
| 4,787,443 | 11/1988 | Fukatsu et al. | 165/907 |
| 4,896,719 | 1/1990 | O'Neill et al. | 165/907 |
| 4,903,761 | 2/1990 | Cima | 122/366 |
| 5,002,122 | 3/1991 | Sarraf et al. | 165/104.26 |
| 5,145,001 | 9/1992 | Valenzuela | 165/907 |
| 5,205,353 | 8/1983 | Willemsen et al. | 165/170 |

Primary Examiner—Albert W. Davis, Jr.
Attorney, Agent, or Firm—Martin Fruitman

[57] ABSTRACT

The invention is a cooling structure for a high power density surface. Liquid is pumped along interconnected and continuous multiple channels on the backside of a sintered metal wick bonded to the cooled surface. The channels are located within a liquid delivery layer which also includes multiple liquid outlet holes, so that each outlet hole is surrounded by interconnected channels. The outlet holes are connected to a manifold to collect the pumped liquid. The input channels which surround each outlet hole are fed from manifolds at the edges of the panels, and the proximity of input channels to the outlet holes assures that liquid flow resistance within the sintered metal wick is minimized by the multiple short, wide paths.

3 Claims, 2 Drawing Sheets

SINGLE PHASE POROUS LAYER HEAT EXCHANGER

SUMMARY OF THE INVENTION

This invention deals generally with heat transfer from a high power density surface, and more specifically with a structure for cooling such a surface by means of a porous layer through which liquid is pumped.

Cooling a high power density surface, that is, a surface to which intense heat is being delivered, is a particularly difficult problem. If the heat is delivered to the surface in multiple locations, or generally across the entire surface, the heat removal must similarly be over the entire surface. In the simplest configurations, such as with liquid flowing through cooling pipes attached to the backside of the heated surface, just the thermal resistance along the heated surface between the heat input point and the heat removal pipe can permit the surface temperature to rise too high.

Even with the use of evaporation cooling it is difficult to accomplish reliable cooling of such a surface. One reason is that high heat input at one location can create a high vapor pressure at that point and prevent additional liquid from reaching that location for generation of additional cooling vapor. Such a situation can lead to destruction of the surface.

Although there have been some approaches to cooling a heated surface without the use of evaporation, they also have not proven entirely satisfactory. U.S. Pat. No. 4,896,719 by O'Neill et al suggests one approach for cooling a surface of low or medium power density. That patent discloses a manifold structure having a large number of identically configured, closely, and equally spaced orifices to deliver a heat exchange medium to the backside of a porous layer bonded to the heated surface. The heat exchange medium is continuously removed from the porous layer by a complimentary group of exhaust openings which are located in a pattern so that they are located between the delivery orifices. The O'Neill et al design intentionally uses the delivery orifices to create the major pressure drop in the cooling medium flow path in order to assure that all the orifices deliver equal cooling medium and thereby maintain the heated panel as isothermal.

The present invention uses an entirely different structure for delivery of a liquid coolant to a porous surface, because experimentation has shown that the pressure drop created at orifices such as O'Neill et al use is a major limitation on the ability to cool high power density surfaces. In effect, in order to attain uniform temperatures across the cooled panel, O'Neill et al use a specific structure which sacrifices cooling ability.

Instead, the goal of the present invention is to eliminate as much pressure drop from the liquid delivery system as is possible, and the result is a system in which the only significant pressure drop is that inherent within the porous metal panel through which the delivered liquid flows.

The present invention accomplishes this low pressure drop liquid delivery by the use of a network of interconnected channels which creates a grid from which liquid is continuously being delivered to a thin porous layer bonded to the back of the heated surface. A liquid outlet port is located within each "island" area set off by the channels of the grid. Thus, even within the porous layer, the liquid flows in a wide cross section path out of the boundary channels around each "island", through the porous metal island, and to the central outlet port. Under such flow conditions, not only is the pressure drop extremely low within the liquid feed system, but also, because of the relatively large cross section paths within the porous metal layer, the pressure drop is also low in the porous metal itself.

This low pressure drop permits delivery of much more cooling liquid to the heated panel, and therefore maintains a low temperature rise within the porous metal layer and its adjacent heated surface. The result is more efficient and more uniform cooling of high power density surfaces than has ever been attained. Furthermore, because the design of the system is modular, there is no limit on the size of the surface which can be cooled. There is no practical difference in the effective cooling whether the dimensions of the cooled panel are measured in millimeters or in meters.

DETAILED DESCRIPTION OF THE INVENTION

Figure 1:
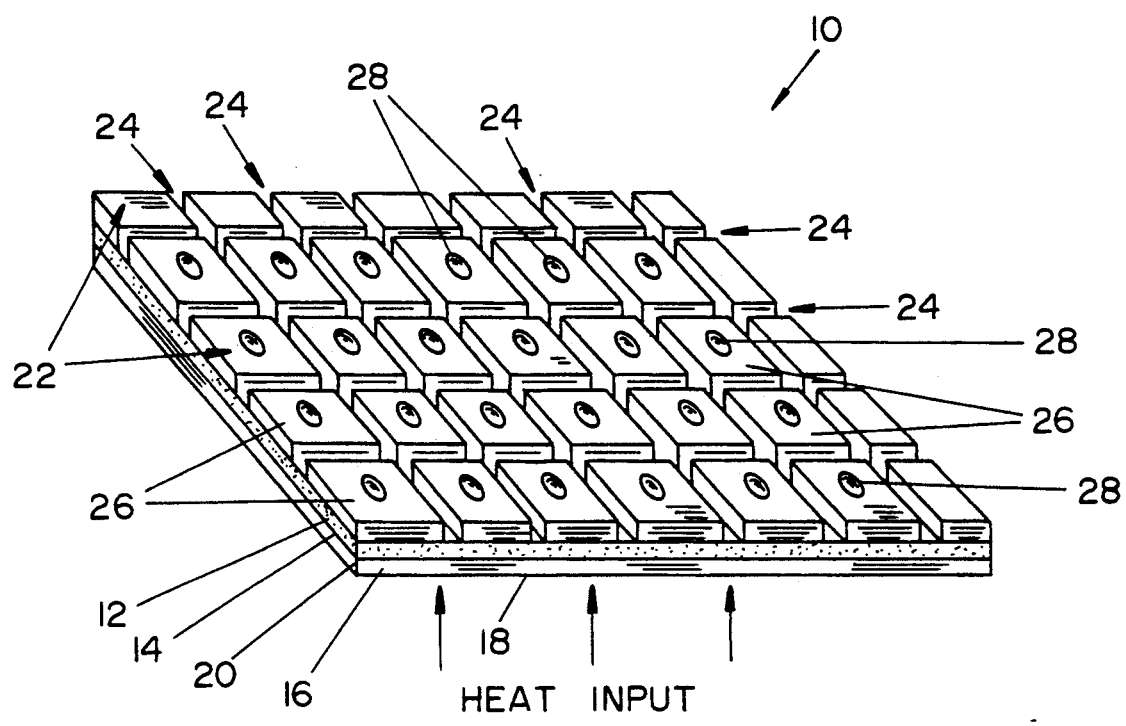
FIG. 1 is a perspective view of an internal portion of the preferred embodiment of the heat exchanger of the invention showing the network of interconnected liquid feed channels within the heat exchanger.

The internal structure of a portion 10 of the heat exchanger of the preferred embodiment is shown in FIG. 1 in which porous metal layer 12 is bonded to backside 14 of panel 16 to which heat is applied. Backside 14 of heated panel 16 is that surface opposite from surface 18 to which heat is applied, and backside 14 is separated from heated surface 18 by thickness 20 of heated panel 16.

Liquid supply layer 22 is attached to the surface of porous metal layer 12 opposite from the surface bonded to heated panel 16, so that the three layers form a unit with porous metal layer 12 sandwiched between liquid supply layer 22 and heated panel 16.

Liquid supply layer 22 is constructed of material which is impervious to the liquid coolant which is used within the heat exchanger, and a network of interconnected continuous channels 24 is formed within layer 22 so that the channels create a pattern of islands 26 within liquid supply layer 22. Channels 24 each have one wall which is actually the surface of porous metal layer 12, so that liquid flowing within channels 24 has direct access to porous metal layer 12. Islands 26 have through holes 28 within them. Holes 28 penetrate from the top surface of liquid supply layer 22 through to porous metal layer 12, and therefore also have direct access to porous metal layer 12.

Channels 24 are used to supply heat exchange liquid to porous metal layer 12, while holes 28 are used as outlet ports through which the heat exchange liquid exits porous metal layer 12. Thus, liquid supplied through interconnected channels 24 flows into and through porous metal layer 12, and then flows out of porous metal layer 12 through holes 28. Because of the repetitive pattern of channels 24 and holes 28, the flow of liquid is through multiple paths, each flow path being from the channels around each hole and into the hole. Such a flow path not only provides a low pressure drop liquid feed to porous layer 12 because of the large entry surface from multiple channels 24 around each island 26, but also yields a low pressure drop within porous layer 12 because of the wide effective width of the liquid flow path from channels 24 to holes 28.

In a typical structure, channels 24 are constructed with a width of 0.023 inch and a height of 0.20 inch and are spaced at 0.236 inch on their centers, while outlet holes 28 are 0.062 inch diameter and are also laid out in a pattern of 0.236 inch spacing at their centers. With such a structure on a four inch diameter panel, with a 0.03 inch thick porous layer of copper material with grain size of 0.01 inch, and with a flow of water at a rate of 0.05 to 0.5 GPM for each island 26, a heat input of 1000 watts per square inch results in a liquid temperature rise of 3 to 30 degrees centigrade while maintaining the panel temperature rise below 50 degrees centigrade.

Figure 2:
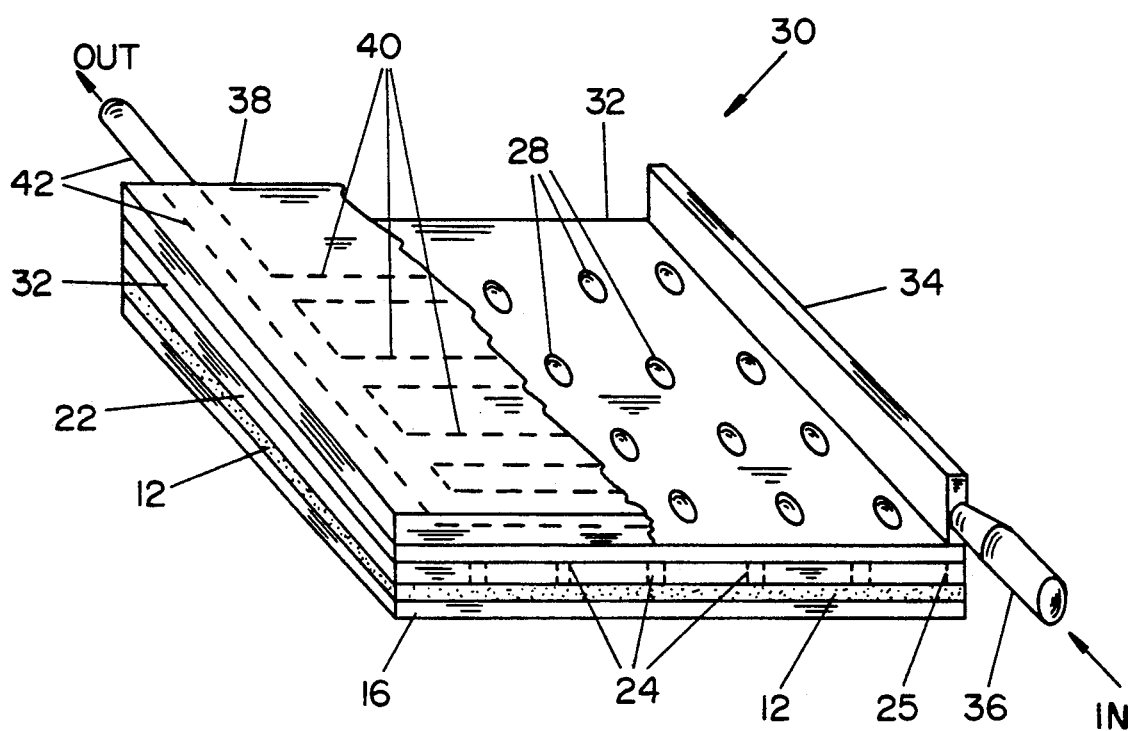
FIG. 2 is a cut away perspective view of a portion of the preferred embodiment of the invention showing the manifolds for feeding and removing liquid from the heat exchanger.

FIG. 2 is a cut away view of a portion of heat exchanger 30 which shows the manifold structures used to supply and remove the heat exchanger liquid from the internal structure shown in FIG. 1.

In order to feed channels 24, supply manifold 34 is connected to any channel 25, and sealing layer 32 is attached to the top of liquid supply layer 22 (FIG. 1), thus fully enclosing all the other channels 24. Pipe 36 is connected to supply manifold 34, and heat exchange liquid is then supplied to pipe 36 under pressure, so that, by flowing through supply manifold 34, through channel 25 to which supply manifold 34 is connected, and all other channels 24, the liquid is forced through porous metal layer 12 and into outlet holes 28.

Sealing layer 32 includes extensions of outlet holes 28, so that liquid flowing through outlet holes 28 reaches outlet manifold layer 38, within which are located outlet channels 40. Outlet channels 40 are connected to and feed the liquid into outlet manifold 42 from which it exits the heat exchanger.

This short, low pressure drop path permits efficient cooling of high power density surfaces with low coolant flow rate and near isothermal coolant temperature.

It is to be understood that the form of this invention as shown is merely a preferred embodiment. Various changes may be made in the function and arrangement of parts; equivalent means may be substituted for those illustrated and described; and certain features may be used independently from others without departing from the spirit and scope of the invention as defined in the following claims.

For example, different supply and outlet manifold configurations could be used, and different size channels and outlet holes are clearly possible. Moreover, the channels need not be straight, and the sealing layer and the liquid supply layer can be combined into one continuous structure.

What is claimed as new and for which Letters Patent of the United States are desired to be secured is:

1. A heat exchanger structure comprising:
   a heated structure including a heated surface and a second surface attached to the heated surface;
   a porous layer with a first surface and a second surface, the first and second surfaces separated by the thickness of the layer, and the first surface of the porous layer being in contact with the second surface of the heated structure;
   a liquid supply layer with a first surface and a second surface, the first and second surfaces separated by the thickness of the layer, and the first surface of the liquid supply layer being in contact with the second surface of the porous layer, the liquid supply layer including a network of intersecting, continuous and interconnected channels, the channels forming sections of the liquid supply layer which are islands separated from each other by the channels, with one boundary of the channels being formed by the porous layer, and the liquid supply layer also including at least one through hole, each hole located in an island formed by the channels within the liquid supply layer;
   a sealing layer which seals the second surface of the liquid supply layer to enclose the channels, and includes extensions aligned with the holes in the liquid supply layer, so that, with the extensions, the holes penetrate through the sealing layer;
   an outlet manifold structure interconnected with the extensions of the holes in the sealing layer and also interconnected with an outlet pipe; and
   a supply manifold interconnected with at least one channel in the liquid supply layer and also interconnected with an inlet pipe.

2. The heat exchanger structure of claim 1 wherein the heated structure is a panel and the heated surface of the heated structure and the second surface of the heated structure are separated by the thickness of the panel.

3. The heat exchanger structure of claim 1 wherein the channels are straight and they intersect each other at right angles.

* * * * *